(12) United States Patent
Moon et al.

(10) Patent No.: US 10,262,841 B2
(45) Date of Patent: Apr. 16, 2019

(54) PLASMA MONITORING DEVICE (71) Applicants: Samsung Electronics Co., Ltd., Suwon-si, Gyeonggi-do (KR); Nanotech Inc., Yongin-si, Gyeonggi-do (KR)

(72) Inventors: Pyung Moon, Seoul (KR); Sung Ho Kang, Osan-si (KR); Ki Chul Kim, Seongnam-si (KR); Un Ki Kim, Suwon-si (KR); Yong Hun Lee, Hwaseong-si (KR); Jae Hee Lee, Daegu (KR); Yong Seok Song, Seoul (KR); Hang Mook Park, Seoul (KR); Je Hoon Oh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 151 days.

(21) Appl. No.: 15/402,749

(22) Filed: Jan. 10, 2017

(65) Prior Publication Data
US 2018/0012737 A1    Jan. 11, 2018

(30) Foreign Application Priority Data

Jul. 11, 2016  (KR) .................. 10-2016-0087404

(51) Int. Cl.
*H01J 37/32* (2006.01)
*H05B 37/02* (2006.01)

(52) U.S. Cl.
CPC .... *H01J 37/32935* (2013.01); *H05B 37/0227* (2013.01)

(58) Field of Classification Search
None
See application file for complete search history.

(56) References Cited

U.S. PATENT DOCUMENTS 5,339,039 A * 8/1994 Carlile ............. H01J 37/32082
                                              204/192.33
5,471,115 A * 11/1995 Hikosaka .......... H01J 37/32935
                                              315/111.21

(Continued)

FOREIGN PATENT DOCUMENTS

| JP | 2004-039952 A | 2/2004 |
| JP | 2010-262887 A | 11/2010 |
| JP | 2011-103387 A | 5/2011 |

*Primary Examiner* — Dion Ferguson
*Assistant Examiner* — Srinivas Sathiraju
(74) *Attorney, Agent, or Firm* — Myers Bigel, P.A.

(57) ABSTRACT

A plasma monitoring device includes a fixing unit, a plasma measuring unit disposed to be in contact with the fixing unit, and measuring a luminous intensity of emitted light of a plasma to output a luminous intensity measurement value, a reference light source unit irradiating reference light having a uniform luminous intensity to the plasma measuring unit, and a control unit receiving the luminous intensity measurement value to calculate a luminous intensity value of the emitted light, controlling a voltage applied to the reference light source unit to uniformly control a luminous intensity of the reference light, comparing a luminous intensity of the reference light irradiated to the plasma measuring unit with a previously stored luminous intensity reference value to detect a correction factor, and applying the correction factor to a luminous intensity value of the emitted light to correct the luminous intensity measurement value.

20 Claims, 6 Drawing Sheets

(56) References Cited

U.S. PATENT DOCUMENTS

| | | | | |
|---|---|---|---|---|
| 5,691,642 A * | 11/1997 | Dobkin | H01J 37/32935 | 250/282 |
| 6,805,810 B2 * | 10/2004 | Smith, Jr. | G01J 3/28 | 216/59 |
| 7,355,171 B2 * | 4/2008 | Ludviksson | C23C 14/54 | 250/288 |
| 7,537,671 B2 * | 5/2009 | Vukovic | C23C 14/52 | 118/712 |
| 7,813,895 B2 * | 10/2010 | Tallavarjula | G01N 21/73 | 439/9 |
| 8,101,906 B2 * | 1/2012 | Tallavarjula | G01J 3/28 | 250/252.1 |
| 8,125,633 B2 * | 2/2012 | Whelan | G01J 3/28 | 356/300 |
| 8,847,159 B2 * | 9/2014 | Chen | H01J 37/32935 | 250/336.1 |
| 9,230,782 B2 * | 1/2016 | Ikegami | H01J 37/321 | |
| 9,299,542 B2 * | 3/2016 | Jung | H01J 37/3299 | |
| 9,412,565 B2 * | 8/2016 | Yoshida | H01J 37/32724 | |
| 9,564,295 B2 * | 2/2017 | Lee | H01J 37/32146 | |
| 9,627,186 B2 * | 4/2017 | Valcore, Jr. | H01J 37/32935 | |
| 9,721,768 B2 * | 8/2017 | Kim | H01J 37/32972 | |
| 9,786,475 B2 * | 10/2017 | Qin | H01J 37/32917 | |
| 9,865,438 B2 * | 1/2018 | Tallavarjula | H01J 37/32972 | |
| 2004/0007983 A1 * | 1/2004 | Sirkis | H01J 37/32266 | 315/111.21 |
| 2004/0104681 A1 * | 6/2004 | Mitrovic | G01N 15/0227 | 315/111.21 |
| 2004/0135517 A1 * | 7/2004 | Schriever | H05G 2/003 | 315/111.21 |
| 2015/0371882 A1 | 12/2015 | Tsai et al. | | |

* cited by examiner

PLASMA MONITORING DEVICE

CROSS-REFERENCE TO RELATED APPLICATION

This application claims benefit of Korean Patent Application No. 10-2016-0087404 filed on Jul. 11, 2016 with the Korean Intellectual Property Office, the disclosure of which is incorporated herein by reference in its entirety.

FIELD

The present inventive concept relates to a plasma monitoring device.

BACKGROUND

In general, plasma refers to an ionized gas state of matter formed of ions, electrons, radicals, or the like. Plasma may be generated by heating a gas to a very high temperature or subjecting a gas to a strong electromagnetic field or a high-frequency electromagnetic field.

A plasma treatment apparatus refers to an apparatus allowing a reactive material to be in a plasma state so that the reactive material in the plasma state may be deposited on a semiconductor substrate, or allowing a semiconductor substrate to be washed, ashed, or etched using a reactive material in a plasma state. The plasma treatment apparatus includes a lower electrode installed inside a chamber to mount a substrate thereon, and an upper electrode installed in an upper portion of the chamber to oppose the lower electrode.

In order to precisely control a plasma treatment process, it is important to be able to accurately monitor the state of plasma during the process. Thus, research into techniques of monitoring the state of plasma used in plasma treatment processes has continued.

SUMMARY

An aspect of the present inventive concept may provide a plasma monitoring device, in which errors and variations in a measurement value of a state of plasma, may be reduced.

An aspect of the present inventive concept may provide a plasma monitoring device including a fixing unit configured to be coupled to a side wall of the reaction chamber so as to abut an observation window provided in the side wall, a plasma measuring unit in contact with a rear end of the fixing unit and configured to measure a luminous intensity of light emitted by the plasma within the reaction chamber via the observation window and to output a luminous intensity measurement value, a reference light source unit configured to irradiate reference light having a uniform luminous intensity to the plasma measuring unit at a predetermined interval of time, and a control unit configured to: receive the luminous intensity measurement value and to calculate a luminous intensity value of the emitted light, control a voltage applied to the reference light source unit to uniformly control a luminous intensity of the reference light, compare the luminous intensity of the reference light with a previously stored luminous intensity reference value to detect a correction factor, and apply the correction factor to a luminous intensity value of the emitted light to, correct the luminous intensity measurement value.

An aspect of the present inventive concept may provide a plasma monitoring device including: a fixing unit configured to be coupled to a side wall of the reaction chamber so as to abut an observation window provided in the side wall, a plasma measuring unit in contact with a rear end of the fixing unit and configured to measure a luminous intensity of light emitted by the plasma within the reaction chamber via the observation window and to output a luminous intensity measurement value, a reference light source unit configured to irradiate reference light having a uniform luminous intensity to the plasma measuring unit at a predetermined interval of time, a temperature measuring unit configured to measure temperatures of the plasma measuring unit and the reference light source unit and to output temperature measurement values, and a control unit configured to: receive the luminous intensity measurement value and to calculate a luminous intensity value of the emitted light, control a voltage applied to the reference light source unit to uniformly control a luminous intensity of the reference light, receive the temperature measurement value and to determine whether the plasma measuring unit and the reference light source unit are operating within a temperature reference range, compare a luminous intensity of the reference light with a previously stored luminous intensity reference value to calculate a difference value, and apply the difference value to the luminous intensity measurement value to correct the luminous intensity measurement value.

An aspect of the present inventive concept may provide a plasma monitoring device including: a body configured to be attached to a side wall of the reaction chamber so as to abut an observation window in the side wall, a plasma measuring unit located within the body that is configured to measure intensity of light emitted by the plasma within the reaction chamber via the observation window, at least one lens located within the body and configured to direct the emitted light from the observation window to the plasma measuring unit, a reference light source located within the body that is configured to irradiate the plasma measuring unit with a reference light, and a control unit configured to: receive a luminous intensity measurement value from the plasma measuring unit and to calculate a luminous intensity value of the emitted light, control a voltage applied to the reference light source unit to uniformly control a luminous intensity of the reference light, compare the luminous intensity of the reference light with a previously stored luminous intensity reference value to detect a correction factor, and apply the correction factor to the luminous intensity measurement value.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Embodiments of the present inventive concept will now be described in detail with reference to the accompanying drawings.

Figure 1:
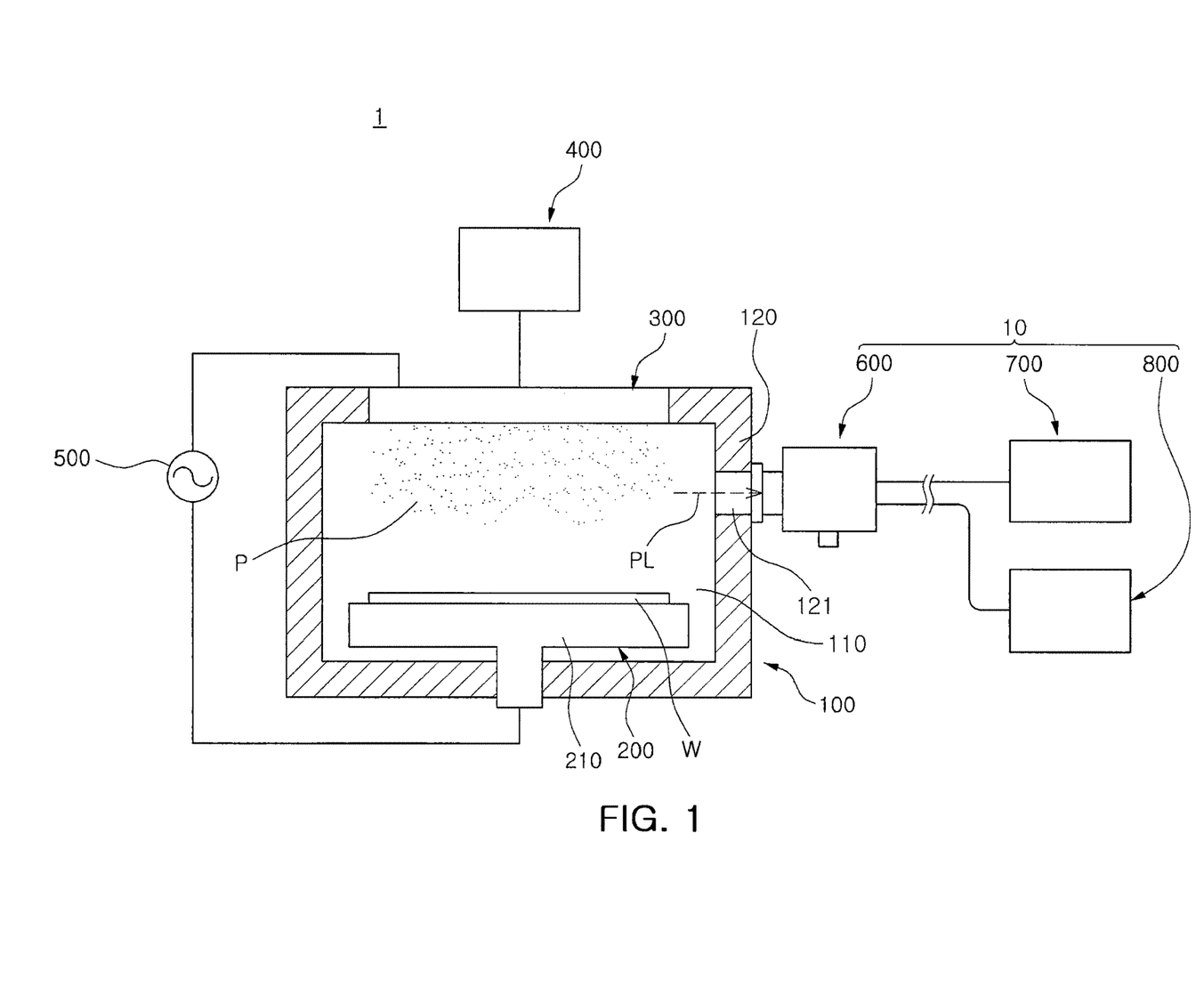
FIG. 1 is a drawing illustrating a plasma monitoring device according to an example embodiment applied to a plasma treatment apparatus.
Figure 2:
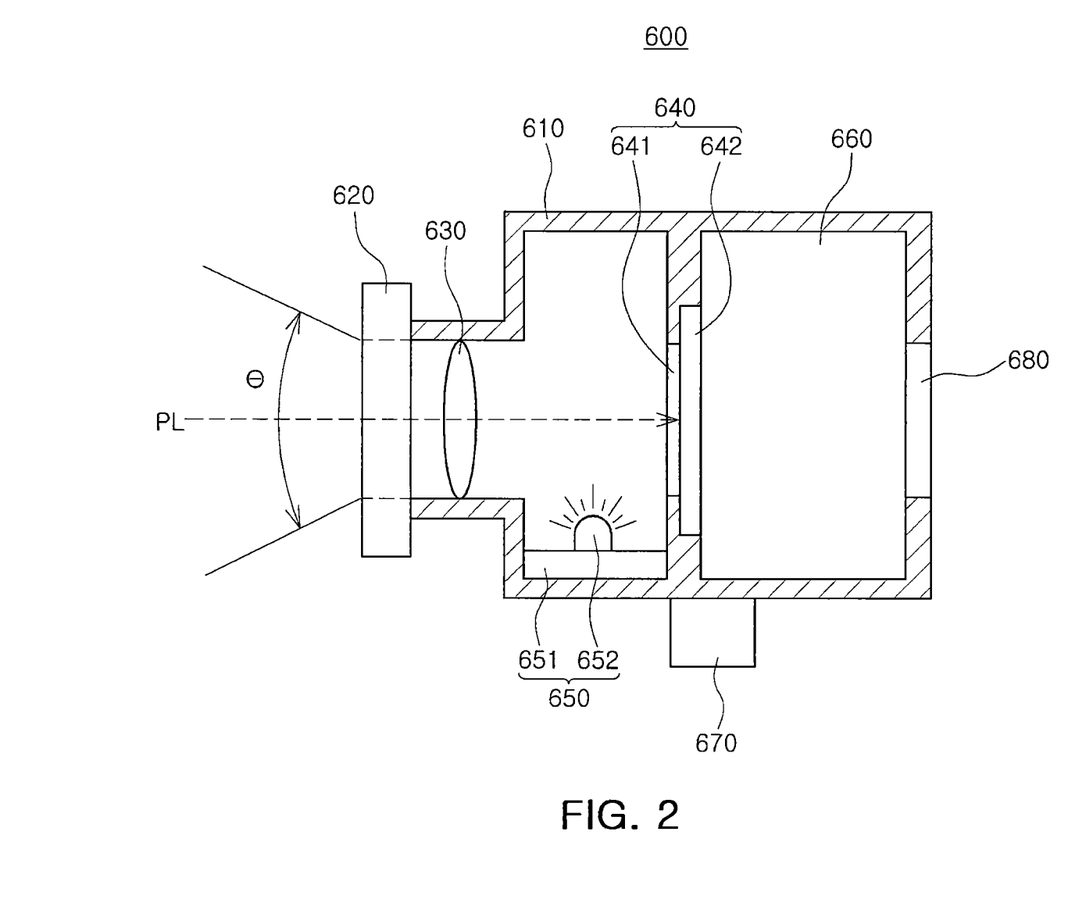
FIG. 2 is a drawing illustrating a sensor unit in FIG. 1.
Figure 3:
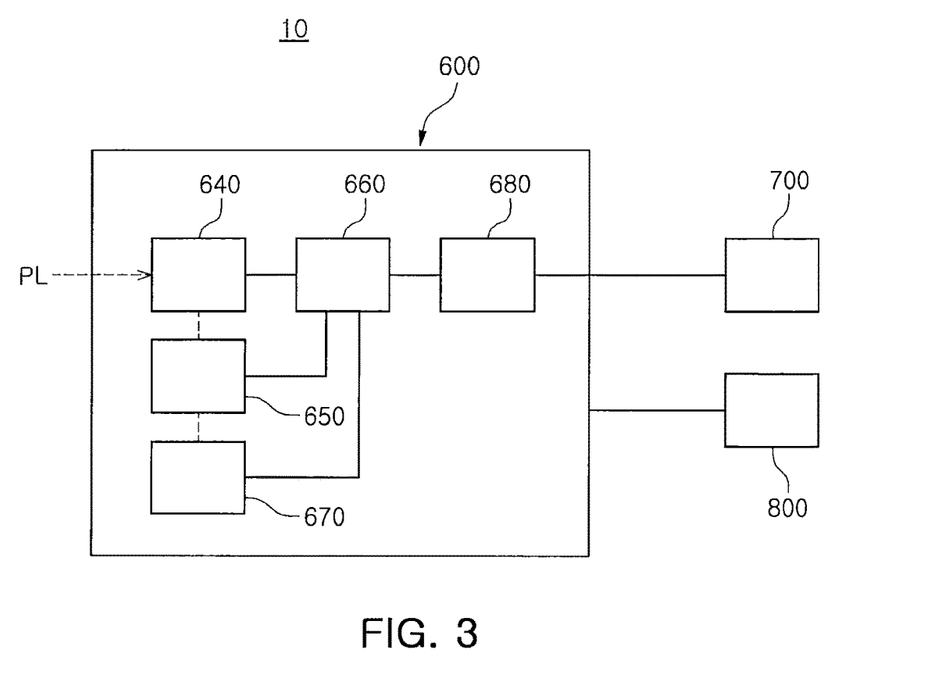
FIG. 3 is a schematic drawing of a plasma monitoring device.
Figure 4:
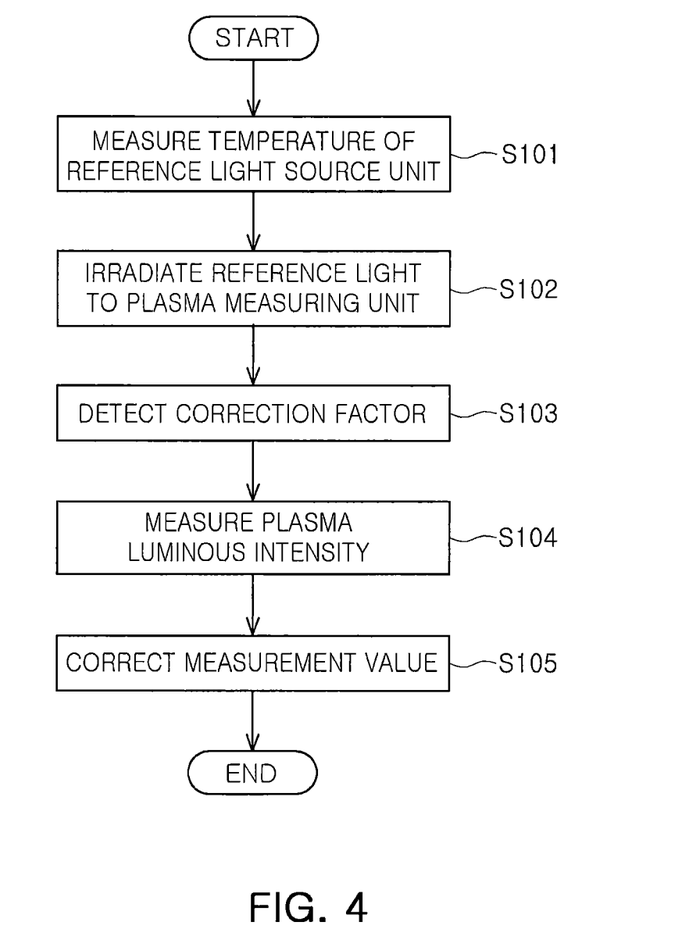
FIG. 4 is a flow chart illustrating a plasma monitoring method using a plasma monitoring device.

With reference to FIGS. 1 to 4, a plasma monitoring device according to an example embodiment will be described. FIG. 1 is a drawing illustrating a plasma monitoring device according to an example embodiment applied to a plasma treatment apparatus, FIG. 2 is a drawing illustrating a sensor unit in FIG. 1, FIG. 3 is a schematic drawing of a plasma monitoring device, and FIG. 4 is a flow chart illustrating a plasma monitoring method using a plasma monitoring device.

With reference to FIG. 1, a plasma monitoring device 10 according to an example embodiment may include a sensor unit 600 attached to an observation window 121 of a reaction chamber 100, a control unit 700 processing a signal transmitted from the sensor unit 600, and a power unit 800 supplying power to the sensor unit 600. In an example embodiment, the control unit 700 and the power unit 800 are separated from each other. In another example embodiment, the control unit 700 and the power unit 800 may be integrally formed. FIG. 1 illustrates a plasma treatment apparatus 1 for the purpose of description.

The plasma monitoring device 10, a device for monitoring a plasma treatment process of processing a semiconductor wafer W or the like, real-time measures a luminous intensity of emitted light PL emitted from plasma P and an irradiation time thereof, to determine a degree of a plasma treatment process.

With reference to FIG. 1, the plasma treatment apparatus 1 may include the reaction chamber 100 forming a reaction space, a shower head 300 located in an upper portion of the reaction chamber 100, and a lower electrode 200 disposed to oppose the shower head 300. The plasma treatment apparatus 1 may further include a process gas supply unit 400 and a power supply unit 500, connected to the shower head 300. However, the plasma treatment apparatus 1 is not limited to the illustrated example embodiment, and a plasma treatment apparatus may be applied thereto in a variety of manners.

The reaction chamber 100 may have an internal space 110 having a predetermined size as a reaction space, and may be formed of a material having excellent abrasion resistance and excellent corrosion resistance. The reaction chamber 100 may allow the internal space 110 to be maintained in a sealed state or a vacuum state, in a plasma treatment process, for example, an etching process.

The shower head 300, a device for distributing process gas to an interior of the reaction chamber 100, allows process gas to be evenly injected to a surface of a semiconductor wafer W through the shower head 300. The shower head 300 may be connected to the power supply unit 500 supplying high-frequency power to serve as an upper electrode.

The lower electrode 200 may be disposed in a lower portion of the shower head 300 inside the reaction chamber 100. The lower electrode 200, for example, may include a support plate 210 formed of aluminum. The semiconductor wafer W, a processed substrate, may be disposed on an upper surface of the support plate 210.

The shower head 300, which is an upper electrode, and the lower electrode 200 may be connected to the power supply unit 500, and the plasma P formed of the process gas may be generated in a space between the shower head 300 and the lower electrode 200.

The observation window 121 allowing a state of the plasma P to be observed by an external observer may be provided in a side wall 120 of the reaction chamber 100, and the observation window 121 may be formed using quartz to block heat inside the reaction chamber 100 and to perform optical observations.

The plasma monitoring device 10 may include the sensor unit 600 directly attached to the observation window 121, the control unit 700 processing a signal transmitted from the sensor unit 600, and the power unit 800 supplying power to the sensor unit 600.

With reference to FIGS. 1 and 2, the sensor unit 600 may include a body unit 610, a fixing unit 620, a lens unit 630, a plasma measuring unit 640, a reference light source unit 650, an analog-to-digital (A-D) converter unit 660, a temperature measuring unit 670, and an input-output unit 680. In addition, the sensor unit may be directly attached to the observation window 121 of the reaction chamber 100 to allow the emitted light PL emitted from the plasma P to be directly transmitted thereto without a separate medium. The sensor unit 600 may be provided as one sensor unit disposed on one reaction chamber 100, but is not limited thereto. A plurality of sensor units 600 may be disposed on one reaction chamber 100 to detect portions of emitted light PL in a plurality of regions of the reaction chamber 100 to transmit the portions of emitted light to the control unit 700. Alternatively, a plurality of sensor units 600 may be disposed on a plurality of the reaction chamber 100, respectively, to transmit the emitted light PL detected from each of the plurality of sensor units 600 to one control unit 700.

The body unit 610 may form an exterior of the sensor unit 600, and may be configured so as not to be deformed even due to a large amount of heat emitted from the reaction chamber 100. In some embodiments, the body unit 610 may be formed of a heat-resistant material blocking heat from being transferred to an internal space.

The fixing unit 620 may be disposed at a front end of the body unit 610, in other words, in a portion to which the emitted light PL is irradiated, to allow the sensor unit 600 to be attached to the reaction chamber 100. The fixing unit 620 may include a coupling member to be fixed to the side wall 120 of the reaction chamber 100, and the coupling member may be provided as various members such as a bolt/nut combination, a screw, or the like.

The lens unit 630 may be disposed at a front end of the plasma measuring unit 640 to collect (i.e., focus or direct) the emitted light PL of the plasma P towards the optical sensor 641. The lens unit 630 may include a single lens, or may include a plurality of lenses. For example, the lens unit 630 may include a condensing lens for collecting the emitted light PL in the plasma measuring unit 640, and may include a wide-angle lens for collecting the emitted light PL irradiated to the plasma measuring unit 640 with wide viewing angle ($\theta$). Thus, the lens unit 630 may have a wide viewing angle of about 70° to about 75°, whereby the emitted light PL irradiated at an incidence angle, not previously able to be measured via conventional methods, may be collected in the plasma measuring unit 640. Thus, a luminous intensity of the emitted light PL may be measured as a value closer to an actual emitted luminous intensity.

The plasma measuring unit 640 may include an optical sensor 641 detecting the emitted light PL of the plasma P and a circuit board 642 in which the optical sensor 641 is embedded. The plasma measuring unit 640 may output a luminous intensity measurement value corresponding to the emitted light PL of the plasma P detected by the optical sensor 641, as an electronic signal.

The reference light source unit 650 may irradiate reference light, and a reference value for correcting the luminous intensity measurement value may be output from the plasma measuring unit 640. The reference light may have a uniform luminous intensity, and may be irradiated at an irradiation angle with a uniform luminous intensity to the optical sensor 641 of the plasma measuring unit 640.

The reference light source unit 650 may include a light source 652 irradiating reference light having a uniform luminous intensity to the plasma measuring unit 640 and a circuit board 651 in which the light source 652 is embedded. The light source 652 may be disposed to be close to the optical sensor 641, to irradiate light having a uniform luminous intensity to the optical sensor 641. The light source 652 may be provided as various members emitting light, such as an LED, a light bulb, a laser device, or the like.

An applied voltage may be controlled by the control unit 700 to allow light having a uniform luminous intensity to be irradiated by the reference light source unit 650, which will be described with reference to FIGS. 6A and 6B.

Figure 6A:
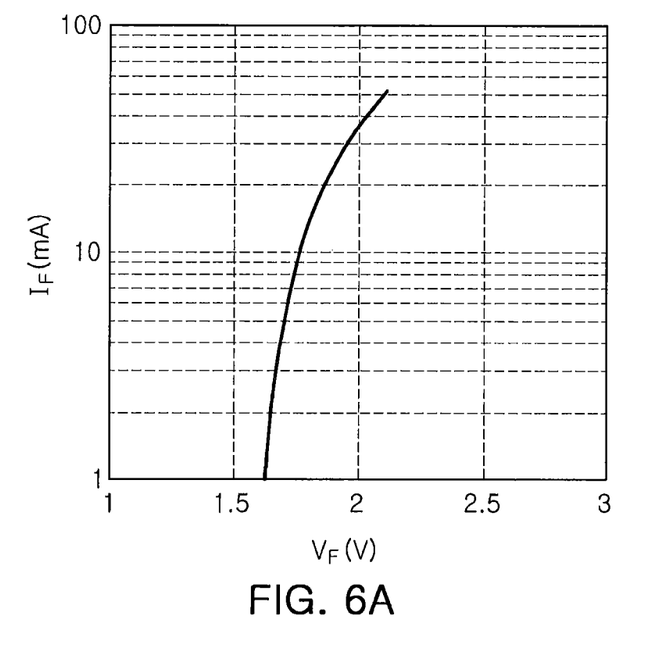
FIG. 6A is a graph illustrating a relationship between a voltage and a current, of a reference light source unit.
Figure 6B:
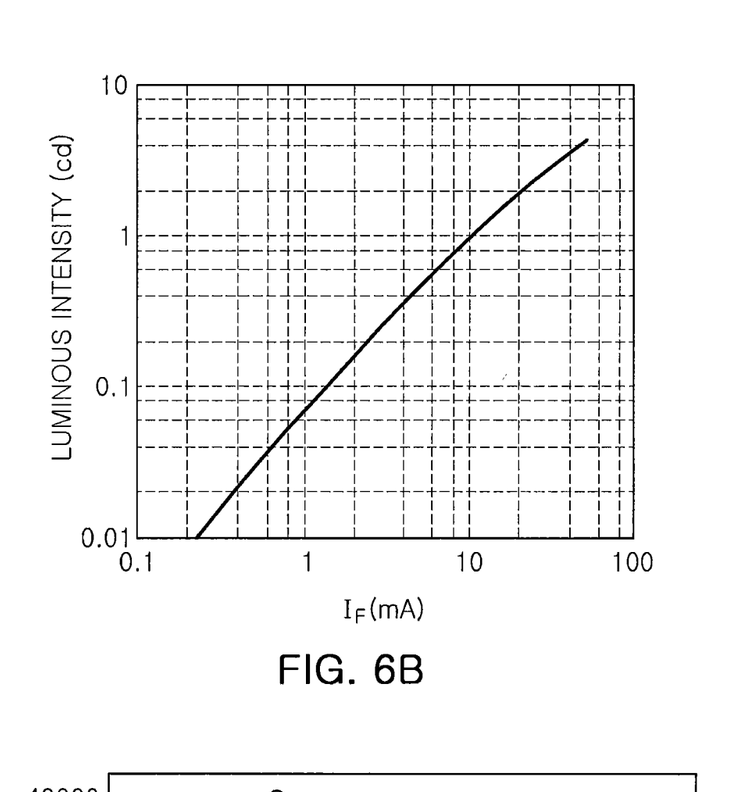
FIG. 6B is a graph illustrating a relationship between a current of a reference light source unit and a luminous intensity.

FIG. 6A is a graph illustrating a relationship between a voltage VF and a current IF, applied to the light source 652, and FIG. 6B is a graph illustrating a relationship between an applied current IF and an emitted luminous intensity. As illustrated in FIG. 6A, a voltage VF applied to the light source 652 is controlled to control a current IF applied thereto. As illustrated in FIG. 6B, a current IF applied to the light source 652 is controlled to control a luminous intensity of light emitted from the light source 652. Thus, a voltage VF applied to the light source 652 is controlled to control a luminous intensity of the light source 652 to be uniformly maintained. However, as a luminous intensity of the light source 652 is influenced by a temperature of the light source 652, a voltage VF is desired to be applied in consideration of a temperature of the light source 652, which will be described later.

The A-D converter unit 660 may A-D convert a luminous intensity measurement value measured by the plasma measuring unit 640 and output the luminous intensity measurement value. In other words, the A-D converter unit 660 is configured to convert an analog value produced by the plasma measuring unit 640 into a digital value. The input-output unit 680 may include a wired and wireless communications port inputting and outputting an electronic signal transmitted between the sensor unit 600 and the control unit 700, and may include a power input terminal to which power applied from the power unit 800 is input.

The temperature measuring unit 670 may include a temperature detection sensor detecting ambient heat to output an electronic signal, and may be disposed in one area of the body unit 610 to measure temperatures of the plasma measuring unit 640 and the reference light source unit 650. The temperature measuring unit 670 may be disposed between the plasma measuring unit 640 and the reference light source unit 650, but is not limited thereto. Alternatively, temperature measuring units may be disposed in the plasma measuring unit 640 and the reference light source unit 650, respectively, to measure a temperature of each area.

The control unit 700 is a device configured to transmit and receive an electronic signal from the sensor unit 600, to store received information, and to analyze the stored information. Control of the sensor unit 600 may be performed via a personal computer (PC) or other computing devices, and may include a display device. To this end, the control unit 700 may be executed while an application is mounted thereon. The control unit 700 may receive an electronic signal through wired and wireless communications with the sensor unit 600, and may store and calculate the received electronic signal to transmit a result value to the sensor unit 600 so as to control the sensor unit.

The power unit 800 may supply power to the sensor unit 600 to allow the sensor unit to be operated. In detail, the power unit may supply direct current power sufficient to allow the sensor unit 600 to be operated.

Next, with reference to FIGS. 3 and 4, operations of the plasma monitoring device 10 described previously will be described. When the plasma P is formed in the reaction chamber 100 and the emitted light PL is emitted through the observation window 121 of the reaction chamber 100, the emitted light PL is collected in the optical sensor 641 (FIG. 2) of the plasma measuring unit 640 through the lens unit 630 (FIG. 2). The plasma measuring unit 640 may output an electronic signal corresponding to a luminous intensity measurement value of emitted light to the A-D converter unit 660. In addition, the A-D converter unit 660 may transmit the A-D converted electronic signal to the input-output unit 680. The electronic signal may be transmitted to the control unit 700 through the input-output unit 680.

The control unit 700 may irradiate reference light having a uniform luminous intensity to the plasma measuring unit 640, and may compare a luminous intensity measurement value at the time when the reference light is irradiated, with a previously stored luminous intensity reference value, so as to confirm that the luminous intensity measurement value transmitted from the plasma measuring unit 640 is a correct value. In addition, a difference between the luminous intensity measurement value and the luminous intensity reference value may be applied to correct the luminous intensity measurement value of the emitted light PL.

With reference to FIG. 4, a process in which the control unit 700 allows a luminous intensity measurement value of emitted light PL to be corrected will be described.

First, measuring a temperature of the reference light source unit 650 is performed to confirm that light irradiated from the light source 652 of the reference light source unit 650 is reference light in S101.

The temperature measuring unit 670 may measure a temperature of the reference light source unit 650, and may transmit a temperature measurement value to the control unit 700 in S101.

The control unit 700 determines whether a received temperature measurement value is within a reference range, and determines that the reference light source unit 650 is operated normally when a temperature measurement value is within a reference range. The reference range of the temperature measurement value may be from about 22° C. to about 26° C. In a case in which the temperature measurement value is outside of the reference range, the control unit stops operations of the sensor unit 600, displayed on a display. Thus, an abnormal state of the plasma monitoring device 10 may be indicated.

Next, when a temperature measurement value is within a reference range, the control unit 700 allows the reference light source unit 650 to be turned-on to irradiate reference light to the plasma measuring unit 640 in S102. The control unit 700 may allow a state in which the reference light source unit is turned-on to be maintained for a predetermined time until light emitted from the turned-on reference light source unit 650 is light having a reference luminous intensity. In other words, the state in which the reference light source unit is turned-on may be maintained until the reference light source unit moves out of an initial start-up state in which light having a reference luminous intensity is not emitted immediately after the light source 652 of the reference light source unit 650 is turned on. In detail, the control unit 700 may allow the reference light source unit to be turned-on for at least one or more minutes.

Figure 5:
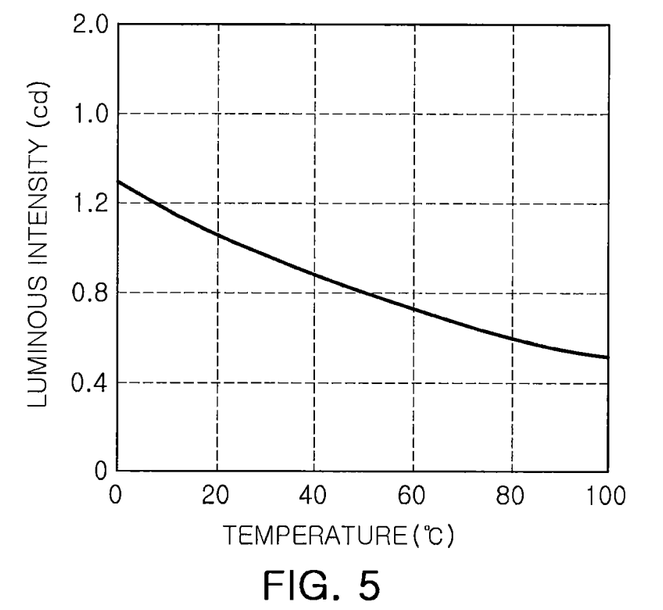
FIG. 5 is a graph illustrating a relationship between a temperature of a reference light source unit and a luminous intensity.

In addition, the control unit 700 may determine a luminous intensity corresponding to a measured temperature, based on a temperature-luminous intensity graph illustrated in FIG. 5, and may adjust a voltage applied to the reference light source unit 650, based on a luminous intensity-current graph illustrated in FIG. 6A and a current-luminous intensity graph illustrated in FIG. 6B. Thus, the control unit may allow the reference light source unit 650 to be controlled to emit reference light having a reference luminous intensity.

Next, the plasma measuring unit 640 may measure a luminous intensity of irradiated reference light to transmit a luminous intensity measurement value to the control unit 700, and the control unit 700 may compare the luminous intensity measurement value measured in the plasma measuring unit 640 with a previously stored luminous intensity reference value, to detect a correction factor for correcting the luminous intensity measurement value to a luminous intensity reference value in S103.

Next, the control unit 700 measures a luminous intensity of the emitted light PL passing through the observation window 121 provided in the side wall 120 of the reaction chamber 100, through the optical sensor 641 of the plasma measuring unit 640 in S104.

Next, the control unit 700 may apply the correction factor to the measured luminous intensity measurement value to correct the luminous intensity measurement value in S105.

The plasma monitoring device in a configuration described above allows a plasma monitoring device 600 to be directly connected to the side wall 120 of the reaction chamber 100, thereby irradiating the emitted light PL emitted from the plasma P directly to the optical sensor 641. Thus, a measurement value in which an error is reduced may be provided, as compared to the case in which emitted light PL, having been transmitted, is measured, after the emitted light PL is transmitted through an optical fiber, or the like. In addition, a reference light source having a uniform luminous intensity may be irradiated to correct a luminous intensity measurement value, thereby reducing variations in a measurement value.

Figure 7:
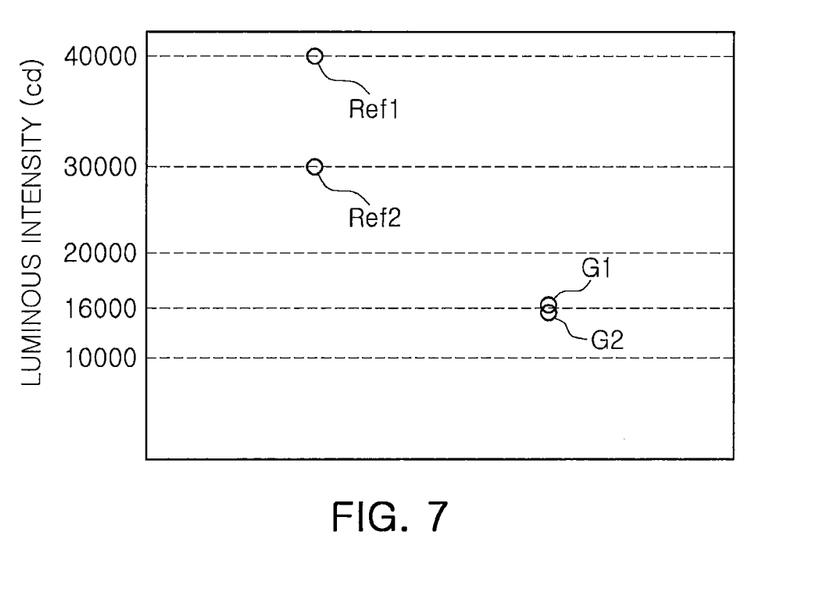
FIG. 7 is a graph illustrating distribution of measurement values of an example according to an example embodiment and a comparative example.

FIG. 7 is a graph in which a luminous intensity measurement value according to an example is compared to that of a comparative example. In the case of the comparative example, one end of an optical fiber is connected to an observation window of a reaction chamber, and a luminous intensity is measured at the other end of the optical fiber.

In an example and a comparative example, plasma treatment processes are performed under the same conditions in two different reaction chambers, respectively, and luminous intensity measurement values of emitted light, emitted while the plasma treatment processes are performed, are illustrated therein. In the case of luminous intensity measurement values Ref1 and Ref2 of the comparative example, emitted light emitted in the plasma treatment processes under the same conditions is measured. However, an error of about 25% between the luminous intensity measurement values Ref1 and Ref2, measured in two reaction chambers, may be seen to occur. Thus, in the case of the comparative example, a state of a reaction chamber may not be determined in such a manner that luminous intensity measurement values measured in a plurality of reaction chambers are compared to each other. On the other hand, in the case of the example, an error between the luminous intensity measurement values G1 and G2 measured in two reaction chambers is determined to be within about 3%. Thus, luminous intensity measurement values measured in a plurality of reaction chambers may be compared to each other to quantitatively determine a state of a reaction chamber.

As set forth above, according to example embodiments of the present inventive concept, a plasma monitoring device may be directly connected to a side wall of a reaction chamber, thereby providing the plasma monitoring device, in which errors and variations in a measurement value of a state of plasma, may be reduced.

While example embodiments have been shown and described above, it will be apparent to those skilled in the art that modifications and variations could be made without departing from the scope of the present disclosure as defined by the appended claims.

What is claimed is:

1. A plasma monitoring device for a reaction chamber having a reaction space in which plasma is formed, the monitoring device comprising:
   a fixing unit configured to be coupled to a side wall of the reaction chamber so as to abut an observation window provided in the side wall;
   a plasma measuring unit in contact with a rear end of the fixing unit and configured to measure a luminous intensity of light emitted by the plasma within the reaction chamber via the observation window and to output a luminous intensity measurement value;
   a reference light source unit configured to irradiate reference light having a uniform luminous intensity to the plasma measuring unit at a predetermined interval of time; and
   a control unit configured to:
   receive the luminous intensity measurement value and to calculate a luminous intensity value of the emitted light;
   control a voltage applied to the reference light source unit to uniformly control a luminous intensity of the reference light;
   compare the luminous intensity of the reference light with a previously stored luminous intensity reference value to detect a correction factor; and
   apply the correction factor to a luminous intensity value of the emitted light to correct the luminous intensity measurement value.

2. The plasma monitoring device of claim 1, further comprising a temperature measuring unit configured to measure a temperature of the reference light source unit and to output a temperature measurement value,
   wherein the control unit is configured to receive the temperature measurement value and to determine whether the reference light source unit is operating normally.

3. The plasma monitoring device of claim 2, wherein the control unit is configured to determine whether the temperature measurement value is within a temperature reference range, and when the temperature measurement value is within the temperature reference range, the reference light source unit is determined to be operating normally.

4. The plasma monitoring device of claim 3, wherein the control unit is configured to turn the reference light source unit on when the temperature measurement value is within the temperature reference range.

5. The plasma monitoring device of claim 4, wherein the control unit is configured to turn the reference light source unit on for at least one minute.

6. The plasma monitoring device of claim 3, wherein the temperature reference range is from 22° C. to 26° C.

7. The plasma monitoring device of claim 2, wherein the control unit is configured to stop operation of the reference light source unit when the temperature measurement value exceeds the temperature reference range.

8. The plasma monitoring device of claim 2, wherein the control unit is configured to stop operation of the plasma measuring unit when the temperature measurement value exceeds the temperature reference range.

9. The plasma monitoring device of claim 1, wherein the fixing unit is directly coupled to the observation window.

10. The plasma monitoring device of claim 1, further comprising a lens unit disposed at a front end of the plasma measuring unit that is configured to direct the emitted light toward the plasma measuring unit.

11. The plasma monitoring device of claim 10, wherein the lens unit comprises a wide angle lens.

12. The plasma monitoring device of claim 1, further comprising an analog-to-digital (A-D) converter configured to convert an analog luminous intensity measurement value produced by the plasma measuring unit into a digital value and to output the digital luminous intensity value to the control unit.

13. A plasma monitoring device for a reaction chamber having a reaction space in which plasma is formed, the monitoring device comprising:
a fixing unit configured to be coupled to a side wall of the reaction chamber so as to abut an observation window provided in the side wall;
a plasma measuring unit in contact with a rear end of the fixing unit and configured to measure a luminous intensity of light emitted by the plasma within the reaction chamber via the observation window and to output a luminous intensity measurement value;
a reference light source unit configured to irradiate reference light having a uniform luminous intensity to the plasma measuring unit at a predetermined interval of time;
a temperature measuring unit configured to measure temperatures of the plasma measuring unit and the reference light source unit and to output temperature measurement values; and
a control unit configured to:
receive the luminous intensity measurement value and to calculate a luminous intensity value of the emitted light;
control a voltage applied to the reference light source unit to uniformly control a luminous intensity of the reference light;
receive the temperature measurement value and to determine whether the plasma measuring unit and the reference light source unit are operating within a temperature reference range;
compare a luminous intensity of the reference light with a previously stored luminous intensity reference value to calculate a difference value; and
apply the difference value to the luminous intensity measurement value to correct the luminous intensity measurement value.

14. The plasma monitoring device of claim 13, wherein the control unit controls a voltage applied to the reference light source unit within a range from 1.6 V to 2.1 V.

15. The plasma monitoring device of claim 13, wherein the temperature measuring unit is disposed between the plasma measuring unit and the reference light source unit.

16. A plasma monitoring device for a reaction chamber in which plasma is formed, the monitoring device comprising:
a body configured to be attached to a side wall of the reaction chamber so as to abut an observation window in the side wall;
a plasma measuring unit located within the body that is configured to measure intensity of light emitted by the plasma within the reaction chamber via the observation window;
at least one lens located within the body and configured to direct the emitted light from the observation window to the plasma measuring unit;
a reference light source located within the body that is configured to irradiate the plasma measuring unit with a reference light; and
a control unit configured to:
receive a luminous intensity measurement value from the plasma measuring unit and to calculate a luminous intensity value of the emitted light;
control a voltage applied to the reference light source unit to uniformly control a luminous intensity of the reference light;
compare the luminous intensity of the reference light with a previously stored luminous intensity reference value to detect a correction factor; and
apply the correction factor to the luminous intensity measurement value.

17. The plasma monitoring device of claim 16, further comprising a temperature measuring unit configured to measure a temperature of the reference light source and to output a temperature measurement value to the control unit.

18. The plasma monitoring device of claim 17, wherein the control unit is configured to determine whether the temperature measurement value is within a temperature reference range.

19. The plasma monitoring device of claim 18, wherein the control unit is configured to turn the reference light source unit on when the temperature measurement value is within the temperature reference range, and wherein the control unit is configured to stop operation of the reference light source unit when the temperature measurement value is not within the temperature reference range.

20. The plasma monitoring device of claim 16, wherein the lens unit comprises a wide angle lens.

* * * * *